United States Patent
Takamoto et al.

(10) Patent No.: US 8,643,194 B2
(45) Date of Patent: Feb. 4, 2014

(54) DICING TAPE-INTEGRATED FILM FOR SEMICONDUCTOR BACK SURFACE

(75) Inventors: Naohide Takamoto, Osaka (JP); Goji Shiga, Osaka (JP); Fumiteru Asai, Osaka (JP); Akiyoshi Yamamoto, Osaka (JP); Tomokazu Takahashi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/088,737

(22) Filed: Apr. 18, 2011

(65) Prior Publication Data

US 2011/0254176 A1    Oct. 20, 2011

(30) Foreign Application Priority Data

Apr. 19, 2010    (JP) .................................. 2010-096298

(51) Int. Cl.
*H01L 23/48* (2006.01)
*H01L 21/50* (2006.01)

(52) U.S. Cl.
USPC ........................................................ 257/778

(58) Field of Classification Search
USPC ............ 257/778, E21.499, E23.01, 782, 783; 438/118, 106, 110, 459, 113
See application file for complete search history.

(56) References Cited

U.S. PATENT DOCUMENTS

| | | | |
|---|---|---|---|
| 5,284,796 A | 2/1994 | Nakanishi et al. | |
| 7,301,222 B1 | 11/2007 | Patwardhan et al. | |
| 7,508,081 B2 | 3/2009 | Matsumura et al. | |
| 7,517,724 B2 | 4/2009 | Hatakeyama et al. | |
| 7,820,487 B2 | 10/2010 | Teshirogi et al. | |
| 7,863,182 B2 | 1/2011 | Matsumura et al. | |
| 7,935,574 B2 | 5/2011 | Saiki et al. | |
| 8,119,236 B2 | 2/2012 | Kamiya et al. | |
| 8,304,341 B2 | 11/2012 | Matsumura et al. | |
| 2004/0104326 A1 | 6/2004 | Demel et al. | |
| 2005/0046042 A1 | 3/2005 | Matsumura et al. | |
| 2005/0208736 A1 | 9/2005 | Matsumura et al. | |
| 2006/0079011 A1* | 4/2006 | Tandy et al. | 438/14 |
| 2006/0102987 A1 | 5/2006 | Saiki et al. | |
| 2006/0148131 A1* | 7/2006 | Matsumura et al. | 438/113 |
| 2007/0090299 A1 | 4/2007 | Kozakai et al. | |
| 2009/0053518 A1 | 2/2009 | Saiki et al. | |
| 2009/0149003 A1 | 6/2009 | Matsumura et al. | |
| 2009/0186451 A1 | 7/2009 | Teshirogi et al. | |

(Continued)

FOREIGN PATENT DOCUMENTS

| | | |
|---|---|---|
| CN | 1497703 A | 5/2004 |
| CN | 101645425 A | 2/2010 |

(Continued)

OTHER PUBLICATIONS

Non-Final Office Action, issued by the US Patent and Trademark Office in U.S. Appl. No. 13/088,738.

(Continued)

*Primary Examiner* — Cathy N Lam

(74) *Attorney, Agent, or Firm* — Sughrue Mion, PLLC

(57) ABSTRACT

The present invention provides a dicing tape-integrated film for semiconductor back surface including: a dicing tape including a base material and a pressure-sensitive adhesive layer on the base material; and a film for flip chip type semiconductor back surface, which is provided on the pressure-sensitive adhesive layer, in which at least a part of the pressure-sensitive adhesive layer has been cured beforehand by irradiation with a radiation ray.

10 Claims, 2 Drawing Sheets

(56) References Cited

U.S. PATENT DOCUMENTS

| | | |
|---|---|---|
| 2009/0209089 A1 | 8/2009 | Murata et al. |
| 2010/0029060 A1 | 2/2010 | Kamiya et al. |
| 2010/0093155 A1 | 4/2010 | Matsumura et al. |
| 2010/0193968 A1 | 8/2010 | Takamoto et al. |
| 2011/0104873 A1 | 5/2011 | Kamiya et al. |
| 2011/0147952 A1 | 6/2011 | Matsumura et al. |
| 2012/0088333 A1 | 4/2012 | Matsumura et al. |

FOREIGN PATENT DOCUMENTS

| | | |
|---|---|---|
| JP | 1-242679 A | 9/1989 |
| JP | 2004-063551 A | 2/2004 |
| JP | 2004-072108 A | 3/2004 |
| JP | 2004-142430 A | 5/2004 |
| JP | 2004-214288 A | 7/2004 |
| JP | 2004-221169 A | 8/2004 |
| JP | 2005-268434 A | 9/2005 |
| JP | 2006-140348 A | 6/2006 |
| JP | 2007-158026 A | 6/2007 |
| JP | 2007-250970 A | 9/2007 |
| JP | 2007-261035 A | 10/2007 |
| JP | 2007-266420 A | 10/2007 |
| JP | 2008-006386 A | 1/2008 |
| JP | 2008-124141 A | 5/2008 |
| JP | 2008-166451 A | 7/2008 |
| JP | 2008-235716 A | 10/2008 |
| JP | 2009-130320 A | 6/2009 |
| JP | 2009170786 A | 7/2009 |
| JP | 2009194303 A | 8/2009 |
| JP | 2010-031183 A | 2/2010 |
| JP | 2010-31183 A | 2/2010 |
| JP | 2010-62542 A | 3/2010 |
| JP | 2011-159694 A | 8/2011 |
| WO | 2008/038345 A1 | 4/2008 |

OTHER PUBLICATIONS

Office Action, dated Jan. 18, 2013, issued by the United States Patent and Trademark Office in co-pending U.S. Appl. No. 13/088,738.
Office Action dated Aug. 2, 2013 issued by the United States Patent and Trademark Office in U.S. Appl. No. 13/088,738.
Communication, dated Apr. 3, 2013, issued by the Japanese Patent Office in Japanese Patent Application No. 2010-096295.
Communication, dated Apr. 5, 2013, issued by the Japanese Patent Office in Japanese Patent Application No. 2010-096295.
US Advisory Action, dated May 24, 2013, issued by the USPTO in U.S. Appl. No. 13/088,738.
Communication, dated Apr. 3, 2013, issued by the Japanese Patent Office in counterpart Japanese Patent Application No. 2010-096298.
Communication, dated Apr. 5, 2013, issued by the Japanese Patent Office in counterpart Japanese Patent Application No. 2010-096298.
Office Action dated Jul. 25, 2013 issued by the State Intellectual Property Office of P.R. China in corresponding Chinese Patent Application No. 201110099960.4.
Office Action, dated Sep. 4, 2013, issued by the Japanese Patent Office, in counterpart Application No. 2010096298.
Notification, dated Sep. 24, 2013, issued by the Japanese Patent Office, in counterpart Application No. 2010096298.
Office Action, dated Sep. 6, 2013, issued by the Japanese Patent Office, in Application No. 2010096295 which corresponds to U.S. Appl. No. 13/088,738.

* cited by examiner

DICING TAPE-INTEGRATED FILM FOR SEMICONDUCTOR BACK SURFACE

FIELD OF THE INVENTION

The present invention relates to a dicing tape-integrated film for semiconductor back surface having a film for flip chip type semiconductor back surface. The film for flip chip type semiconductor back surface is used for protecting a back surface of a semiconductor element such as a semiconductor chip and enhancing strength. Moreover, the invention relates to a process for producing a semiconductor device using the dicing tape-integrated film for semiconductor back surface and a flip chip-mounted semiconductor device.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 10).
Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

However, in order to protect a back surface of a semiconductor chip by the protective film, it is necessary to add a new step for attaching the protective film to the back surface of the semiconductor chip obtained in a dicing step. As a result, the number of steps increases and production cost and the like increase. Accordingly, for the purpose of reducing the production cost, the present inventors have developed a dicing tape-integrated film for semiconductor back surface. The dicing tape-integrated film for semiconductor back surface has a structure including a dicing tape having a base material and a pressure-sensitive adhesive layer on the base material, and a film for flip chip type semiconductor back surface formed on the pressure-sensitive adhesive layer of the dicing tape. At the production of the semiconductor device, the dicing tape-integrated film for semiconductor back surface is used as follows. First, a semiconductor wafer is attached onto the film for flip chip type semiconductor back surface in the dicing tape-integrated film for semiconductor back surface. Next, the semiconductor wafer is diced to form a semiconductor element. Subsequently, the semiconductor element is peeled from the pressure-sensitive adhesive layer of the dicing tape and picked up together with the film for flip chip type semiconductor back surface and then the semiconductor element is flip chip-connected onto an adherend such as a substrate. Consequently, a flip chip type semiconductor device is obtained.

However, in the dicing tape-integrated film for semiconductor back surface described in the above, in the case where close adhesiveness of the pressure-sensitive adhesive layer with the film for flip chip type semiconductor back surface is high, picking-up of the semiconductor element becomes difficult in some cases. Moreover, there may be considered a method of using a radiation-curable type pressure-sensitive adhesive layer as the pressure-sensitive adhesive layer and radiation-curing the pressure-sensitive adhesive layer at the picking-up of the semiconductor element to improve the picking-up property, but there is a case where warp occurs over the whole dicing tape-integrated film for semiconductor back surface due to curing and contraction of the pressure-sensitive adhesive layer.

SUMMARY OF THE INVENTION

The present invention has been made in consideration of the foregoing problem and an object thereof is to provide a dicing tape-integrated film for semiconductor back surface which is capable of easily peeling the semiconductor element at the picking-up together with the film for flip chip type semiconductor back surface and thereby capable of improving production yield, and a process for producing a semiconductor device.

In order to solve the foregoing problems, the present inventors made extensive and intensive investigations. As a result, it has been found that the foregoing problems can be solved by adopting the following configuration, thereby leading to accomplishment of the invention.

Namely, the present invention provides a dicing tape-integrated film for semiconductor back surface comprising:

a dicing tape comprising a base material and a pressure-sensitive adhesive layer on the base material; and a film for flip chip type semiconductor back surface, which is provided on the pressure-sensitive adhesive layer, wherein at least a part of the pressure-sensitive adhesive layer has been cured beforehand by irradiation with a radiation ray.

As the configuration above, owing to a pressure-sensitive adhesive layer cured beforehand by irradiation with, a radiation ray, for example, a good peeling property is exhibited between the pressure-sensitive adhesive layer and the film for flip chip type semiconductor back surface at the picking-up of the semiconductor element without irradiation with a radiation ray. As a result, the picking-up property can be improved. Moreover, since a step of irradiation with a radiation ray is unnecessary, the number of production steps for producing a semiconductor device can be decreased and also the production cost can be reduced.

The film for flip chip type semiconductor back surface is preferably one that is attached onto the pressure-sensitive adhesive layer cured beforehand by irradiation with a radiation ray. According to this configuration, the surface of the pressure-sensitive adhesive layer is hard and, at the attachment to the film for flip chip type semiconductor back surface, it becomes possible to lower close adhesiveness between both. Accordingly, an anchoring effect between the pressure-sensitive adhesive layer and the film for flip chip type semiconductor back surface is reduced and, for example, the peeling property between the pressure-sensitive adhesive layer and the film for flip chip type semiconductor back surface becomes good at the picking-up of the semiconductor chip. As a result, the picking-up property can be improved. Moreover, when the pressure-sensitive adhesive layer is cured by irradiation with a radiation ray, the volume of the pressure-sensitive adhesive layer is diminished due to the formation of a crosslinked structure. Therefore, for example, when the pressure-sensitive adhesive layer cured by irradiation with a radiation ray is formed after the attachment to the film for flip chip type semiconductor back surface, a stress is imparted to the film for flip chip type semiconductor back surface. As a result, warp occurs over the whole dicing tape-integrated film for semiconductor back surface in some cases. However, in the above-described configuration, the film for flip chip type semiconductor back surface is attached and formed after the pressure-sensitive adhesive layer is cured by irradiation with a radiation ray, so that the impartment of unnecessary stress to the film for flip chip type semiconductor back surface can be prevented. As a result, a dicing tape-integrated film for semiconductor back surface without warp is obtained.

The part of the pressure-sensitive adhesive layer cured beforehand by irradiation with a radiation ray is preferably a part corresponding to the semiconductor wafer-attaching part in the above-described film for flip chip type semiconductor back surface. According to this configuration, by previously curing the part of the pressure-sensitive adhesive layer that corresponds to the semiconductor wafer-attaching part by irradiation with a radiation ray, pressure-sensitive adhesive force is lowered only at the part. Consequently, pressure-sensitive adhesive force is not reduced in the other part of the pressure-sensitive adhesive layer and thus, occurrence of chip fly can be suppressed at the dicing of the semiconductor wafer and a sufficient holding force for processing semiconductor wafer can be exhibited.

The film for flip chip type semiconductor back surface preferably contains a colorant. Owing to this constitution, the film for flip chip type semiconductor back surface can have a function of exhibiting an excellent laser marking property and an excellent appearance property. As a result, for example, marking can be performed to impart various kinds of information such as literal information and graphical information to the face on the non-circuit side of the semiconductor element or a semiconductor device using the semiconductor element by utilizing any of various marking methods such as a printing method and a laser marking method through the film for flip chip type semiconductor back surface. Moreover, the film for flip chip type semiconductor back surface and the dicing tape can be easily distinguished from each other and hence workability and the like can be enhanced.

In addition, the present invention also provides a process for producing a semiconductor device using the above-mentioned dicing tape-integrated film for semiconductor back surface, the process comprising:

attaching a semiconductor wafer onto the film for flip chip type semiconductor back surface in the dicing tape-integrated film for semiconductor back surface, dicing the semiconductor wafer to form a semiconductor element, peeling the semiconductor element from the pressure-sensitive adhesive layer of the dicing tape together with the film for flip chip type semiconductor back surface, and flip chip-connecting the semiconductor element onto an adherend, wherein, the pressure-sensitive adhesive layer is not irradiated with a radiation ray from the attaching of the semiconductor wafer until the peeling of the semiconductor element.

According to this process, since the dicing tape-integrated film for semiconductor back surface including a pressure-sensitive adhesive layer cured beforehand by irradiation with a radiation ray is used, the picking-up of the semiconductor element can be well performed without irradiating the pressure-sensitive adhesive layer with a radiation ray. Namely, since the step of irradiation with a radiation ray is unnecessary, it becomes possible to decrease the number of production steps for producing the semiconductor device and thus production cost can be reduced. Furthermore, even in the case where the semiconductor wafer has a prescribed circuit pattern, occurrence of troubles in the circuit pattern caused by the irradiation with a radiation ray can be prevented. As a result, it becomes possible to produce a highly reliable flip chip type semiconductor device.

Moreover, the present invention also provides a flip chip type semiconductor device which is manufactured by the process for producing a semiconductor device as described in the above.

According to the invention, in the dicing tape-integrated film for semiconductor back surface including a dicing tape including a base material and a radiation-curable pressure-sensitive adhesive layer on the base material and a film for flip chip type semiconductor back surface formed on the pressure-sensitive adhesive layer, the pressure-sensitive adhesive layer cured beforehand by irradiation with a radiation ray is adopted. Therefore, a good peeling between the pressure-sensitive adhesive layer and the film for flip chip type semiconductor back surface becomes possible even without irradiation with a radiation ray. As a result, for example, at the picking-up of a semiconductor element, the step of irradiation with a radiation ray is unnecessary and it becomes possible to decrease the number of production steps. Furthermore, even in the case where a semiconductor wafer has a prescribed circuit pattern, occurrence of troubles in the circuit pattern caused by the irradiation with a radiation ray can be prevented. As a result, it is possible to produce a highly reliable flip chip type semiconductor device while reducing production cost.

Figure 1:
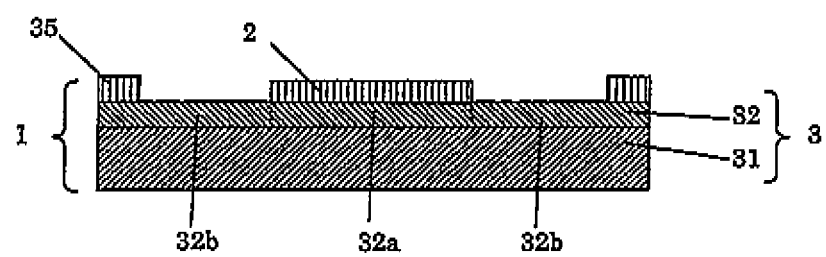
FIG. 1 is a cross-sectional schematic view showing one embodiment of a dicing tape-integrated film for semiconductor back surface of the invention.

| Description of Reference Numerals and Signs | |
|---|---|
| 1, 11 | Dicing tape-integrated film for semiconductor back surface |
| 2, 12 | Film for semiconductor back surface |
| 3 | Dicing tape |
| 4 | Semiconductor wafer |
| 5 | Semiconductor chip |
| 6 | Adherend |
| 12a | Semiconductor wafer-adhering part |
| 12b | Part other than semiconductor wafer-adhering part |
| 31 | Base material |
| 32 | Pressure-sensitive adhesive layer |
| 32a | Part corresponding to semiconductor wafer-adhering part |
| 32b | Part other than part corresponding to semiconductor water-adhering part |
| 51 | Bump formed at circuit face side of semiconductor chip 5 |
| 61 | Conductive material for conjunction adhered to connecting pad of adherend 6 |

BEST MODE FOR CARRYING OUT THE INVENTION

Figure 2:
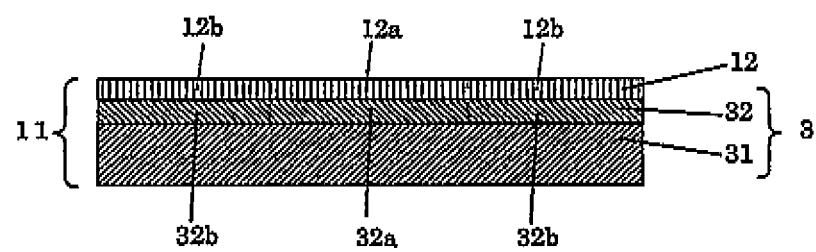
FIG. 2 is a cross-sectional schematic view showing another embodiment of a dicing tape-integrated film for semiconductor back surface of the invention.

Embodiments of the present invention are described with reference to FIGS. 1 and 2 but the invention is not restricted to these embodiments. FIG. 1 is a cross-sectional schematic view showing one embodiment of a dicing tape-integrated film for semiconductor back surface according to the present embodiment. FIG. 2 is a cross-sectional schematic view showing another embodiment of a dicing tape-integrated film for semiconductor back surface according to the present embodiment. Incidentally, in the figures in the present specification, parts that are unnecessary for the description are not given, and there are parts shown by magnifying, minifying, etc. in order to make the description easy.

(Dicing Tape-Integrated Film for Semiconductor Back Surface)

As shown in FIG. 1, the dicing tape-integrated film for semiconductor back surface 1 (hereinafter sometimes also referred to as "dicing tape-integrated semiconductor back surface protective film", "film for semiconductor back surface with dicing tape", or "semiconductor back surface protective film with dicing tape") has a configuration including: the dicing tape 3 including the pressure-sensitive adhesive layer 32 formed on the base material 31 and the film for flip chip type semiconductor back surface 2 (hereinafter sometimes referred to as "film for semiconductor back surface" or "semiconductor back surface protective film") formed on the pressure-sensitive adhesive layer 32. The film for semiconductor back surface 2 is formed only on the part 32a corresponding to the semiconductor wafer-attaching part. Moreover, the invention may be the dicing tape-integrated film for semiconductor back surface 11 having a configuration including the film for semiconductor back surface 12 provided over the whole surface of the pressure-sensitive adhesive layer 32. Incidentally, the surface of the film for semiconductor back surface 2 (surface to be attached to the back surface of the wafer) may be protected with a separator or the like until the film is attached to the wafer back surface.

(Film for Flip Chip Type Semiconductor Back Surface)

The film for semiconductor back surface 2 (or 12) has a film shape. The film for semiconductor back surface 2 (or 12) is usually in an uncured state (including a semi-cured state) in the embodiment of the dicing tape-integrated film for semiconductor back surface as a product and is thermally cured after the dicing tape-integrated film for semiconductor back surface is attached to the semiconductor wafer (details will be described later).

The film for semiconductor back surface 2 (or 12) can be formed of a resin composition and is preferably formed of a resin, composition containing a thermosetting resin component and a thermoplastic resin component. Moreover, the film for semiconductor back surface 2 (or 12) may be constituted by a thermoplastic resin composition using no thermosetting resin component or may be constituted by a thermosetting resin composition using no thermoplastic resin component.

Examples of the thermoplastic resin component include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyimide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl(meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth)acrylate means acrylate and/or methacrylate, (meth)acryl means acryl and/or methacryl, etc., which shall be applied over the whole specification.

Moreover, examples of the thermosetting resin component include, in addition to an epoxy resin and a phenol resin, an amino resin, an unsaturated polyester resin, a polyurethane resin, a silicone resin and a thermosetting polyimide resin. The thermosetting resin component may be employed singly or in a combination of two or more kinds. As the thermosetting resin component, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenyloletbane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

In the invention, a thermal curing-accelerating catalyst for the epoxy resins and the phenol resins may be used. The thermal curing-accelerating catalyst is not particularly restricted and can be suitably selected from known thermal curing-accelerating catalysts and used. The thermal curing-accelerating catalyst may be employed singly or in a combination of two or more kinds. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The film for semiconductor back surface is particularly suitably formed of a resin composition containing an epoxy resin and a phenol resin or a resin composition containing an epoxy resin, a phenol resin, and an acrylic resin. Since these resins contain only a small amount of ionic impurities and have high heat resistance, reliability of the semiconductor element can be secured. The mixing ratio in this case is not particularly restricted but, for example, in the case where the acrylic resin is contained, the mixing amount of the epoxy resin and the phenol resin can be appropriately selected from the range of 10 to 200 parts by weight based on 100 parts by weight of the acrylic resin component.

It is important that the film for semiconductor back surface 2 (or 12) has adhesiveness (close adhesiveness) to the back surface (non-circuit-formed face) of the semiconductor wafer. The film for semiconductor back surface 2 (or 12) can be, for example, formed of a resin composition containing an epoxy resin as a thermosetting resin component. In the case where the film for semiconductor back surface 2 (or 12) is cured beforehand to some degree, at its preparation, a polyfunctional compound capable of reacting with a functional group or the like at a molecular chain end of the polymer can be added as a crosslinking agent. Thereby, an adhesive characteristics under high temperature can be enhanced and an improvement of the heat resistance can be achieved.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The film for semiconductor back surface 2 (or 12) is preferably colored, Thereby, an excellent laser marking property and an excellent appearance property can be exhibited, and it becomes possible to make a semiconductor device having a value-added appearance property. As above, since the colored film for semiconductor back surface 2 (or 12) has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the film of semiconductor back surface 2 (or 12). Particularly, by controlling the color of coloring, it becomes possible to observe the information (for example, literal information and graphical information) imparted by marking with excellent visibility. Moreover, when the film for semiconductor back surface is colored, the dicing tape and the film for semiconductor back surface can be easily distinguished from each other, so that workability and the like can be enhanced. Furthermore, for example, as a semiconductor device, it is possible to classify products thereof by using different colors. In the case where the film for semiconductor back surface 2 (or 12) is colored (the case where the film is neither colorless nor transparent), the color shown by coloring is not particularly limited but, for example, is preferably dark color such as black, blue or red color, and black color is especially suitable.

In the present embodiment, dark color basically means a dark color having L*, defined in L*a*b* color space, of 60 or smaller (0 to 60), preferably 50 or smaller (0 to 50), and more preferably 40 or smaller (0 to 40).

Moreover, black color basically means a black-based color having L*, defined in L*a*b* color space, of 35 or smaller (0 to 35), preferably 30 or smaller (0 to 30), and more preferably 25 or smaller (0 to 25). In this regard, in the black color, each of a* and b*, defined in the L*a*b* color space, can be suitably selected according to the value of L*. For example, both of a* and b* are within the range of preferably −10 to 10, more preferably −5 to 5, and further preferably −3 to 3 (particularly 0 or about 0).

In the present embodiment, L*, a*, and b* defined in the L*a*b* color space can be determined by a measurement with a color difference meter (a trade name "CR-200" manufactured by Minolta Ltd; color difference meter). The L*a*b* color space is a color space recommended by the Commission Internationale de l'Eclairage (Cu) in 1976, and means a color space called CIE1976(L*a*b*) color space. Also, the L*a*b* color space is defined in Japanese Industrial Standards in JIS Z8729.

At coloring of the film for semiconductor back surface 2 (or 12), according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface 2 (or 12), so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface 2 (or 12) in the dicing tape-integrated film for semiconductor back surface 1 can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant). The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film for semiconductor back surface 2 (or 12) is colored, the colored form is not particularly restricted. The film for semiconductor back surface may be, for example, a single-layer Elm-shaped article added with a coloring agent. Moreover, the film may be a laminated film where a resin layer formed of at least a thermosetting resin component and a coloring agent layer are at least laminated. In this regard, in the case where the film for semiconductor back surface 2 (or 12) is a laminated film of the resin layer and the coloring agent layer, the film for semiconductor back surface 2 (or 12) in the laminated form preferably has a laminated form of a resin layer/a coloring agent layer/a resin layer. In this case, two resin layers at both sides of the coloring agent layer may be resin layers having the same composition or may be resin layers having different composition.

Into the film for semiconductor back surface 2 (or 12), other additives can be suitably blended according to the necessity. Examples of the other additives include an extender, an antiaging agent, an antioxidant, and a surfactant, in addition to a filler, a flame retardant, a silane-coupling agent, and an ion-trapping agent.

The filler may be any of an inorganic filler and an organic filler but an inorganic filler is suitable. By blending a filler such as an inorganic filler, imparting of electric conductivity to the film for semiconductor back surface, improvement of the thermal conductivity, control of elastic modulus, and the like can be achieved. In this regard, the film for semiconductor back surface 2 (or 12) may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. The average particle diameter of the inorganic filler is preferably within the range of 0.1 µm to 80 µm. The average particle diameter of the inorganic filler can be measured by a laser diffraction-type particle size distribution measurement apparatus.

The blending amount of the filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface 2 (or 12) can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film for semiconductor back surface 2 (or 12) is formed of a resin composition containing a thermosetting resin component such as an epoxy resin, the film for semiconductor back surface 2 (or 12) is in a state that the thermosetting resin component is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin component in the film for semiconductor back surface 2 (or 12) is completely or almost completely cured.

As above, since the film for semiconductor back surface 2 (or 12) is in a state that the thermosetting resin component is uncured or partially cured even when the film contains the thermosetting resin component, the gel fraction of the film for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film for semiconductor back surface 2 (or 12) can be measured by the following measuring method.

<Gel Fraction Measuring Method>

About 0.1 g of a sample is sampled from the film for semiconductor back surface 2 (or 12) and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

$$\text{Gel fraction(\% by weight)} = [(\text{Weight after immersion and Drying})/(\text{Weight of sample})] \times 100 \quad (a)$$

The gel fraction of the film for semiconductor back surface 2 (or 12) can be controlled by the kind and content of the resin components and the kind and content of the crosslinking agent and besides, heating temperature, heating time and the like.

In the invention, in the case where the film for semiconductor back surface 2 (or 12) is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the film for semiconductor back surface 2 (or 12) absorbs moisture to have a moisture content of a normal state or more in some cases. When flip chip bonding is performed with still maintaining such a high moisture content, water vapor remains at the adhesion interface between the film for semiconductor back surface 2 (or 12) and the semiconductor wafer or its processed body (semiconductor) and lifting is generated in some cases. Therefore, by constituting the film for semiconductor back surface 2 (or 12) as a configuration in which a core material having a high moisture permeability is provided on each surface thereof, water vapor diffuses and thus it becomes possible to avoid such a problem. From such a viewpoint, a multilayered structure in which the film for semiconductor back surface 2 (or 12) is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the film for semiconductor back surface 2 (or 12) is not particularly restricted but can be, for example, suitably selected from the range of about 2 μm to 200 μm. Furthermore, the thickness is preferably about 4 μm to 160 μm, more preferably about 6 μm to 100 μm, and particularly about 10 μm to 80 μm.

The tensile storage elastic modulus of the film for semiconductor back surface 2 (or 12) in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the film for semiconductor back surface to a support can be effectively suppressed or prevented at the time when the film for semiconductor back surface 2 (or 12) is placed on the support and transportation and the like are performed after the semiconductor chip is peeled from the pressure-sensitive adhesive layer 32 of the dicing tape together with the film for semiconductor back surface 2 (or 12). In this regard, the support is, for example, a top tape, a bottom tape, and the like in a carrier tape. In the case where the film for semiconductor back surface 2 (or 12) is formed of a resin composition containing a thermosetting resin component, as mentioned above, the thermosetting resin component is usually in a uncured or partially cured state, so that the tensile storage elastic modulus of the film for semiconductor back surface at 23° C. is a tensile storage elastic modulus at 23° C. in a state that the thermosetting resin component is uncured or partially cured.

Here, the film for semiconductor back surface 2 (or 12) may be either a single layer or a laminated film where a plurality of layers are laminated. In the case of the laminated film, the tensile storage elastic modulus is sufficiently 1 GPa or more (e.g., 1 GPa to 50 GPa) as the whole laminated film. Also the tensile storage elastic modulus (23° C.) of the film for semiconductor back surface in an uncured state can be controlled by suitably setting up the kind and content of the resin components (thermoplastic resin and/or thermosetting resin) or the kind and content of a filler such as a silica filler. In the case where the film for semiconductor back surface 2 (or 12) is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the film for semiconductor back surface 2 (or 12) in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

In the dicing tape-integrated film for semiconductor back surface 1 shown in FIG. 1, it is preferred to design the film so that the pressure-sensitive adhesive force of the film for semiconductor back surface 2 toward the semiconductor wafer is larger than the pressure-sensitive adhesive force (to be mentioned later) toward the foregoing part 32*a* of the pressure-sensitive adhesive layer 32. The pressure-sensitive adhesive force toward the semiconductor wafer is suitably set up depending on the kind but, in view of the reliability at dicing, picking-up, and die bonding as well as picking-up property, the pressure-sensitive adhesive force is preferably within the range of 0.5 N/20 mm to 15 N/20 mm, more preferably within the range of 0.7 N/20 mm to 10 N/20 mm. Moreover, the pressure-sensitive adhesive force of the film for semiconductor back surface 2 toward the foregoing part 32*a* is preferably within the range of 0.02 N/20 mm to 10 N/20 mm, more preferably within the range of 0.05 N/20 mm to 5 N/20 mm. Incidentally, the pressure-sensitive adhesive force is a value measured under conditions of an ordinary temperature (23° C.), a peeling angle of 180', and a peeling rate of 300 mm/min.

In the dicing tape-integrated film for semiconductor back surface 11 shown in FIG. 2, it is preferred to design the film so that the pressure-sensitive adhesive force of the semiconductor wafer-attaching part 12*a* toward the semiconductor wafer is larger than the pressure-sensitive adhesive force (to be mentioned later) toward the part 32*a* of the pressure-sensitive adhesive layer 32. The pressure-sensitive adhesive force toward the semiconductor wafer is suitably set up depending on the kind but, in view of the reliability at dicing, picking-up, and die bonding as well as the picking-up property, as described above, the pressure-sensitive adhesive force is preferably within the range of 0.5 N/20 mm to 15 N/20 mm, more preferably within the range of 0.7 N/20 mm to 10 N/20 mm. Moreover, the pressure-sensitive adhesive force of the semiconductor wafer-attaching part 12*a* toward the foregoing part 32*a* is preferably within the range of 0.02 N/20 mm to 10 N/20 mm, more preferably within the range of 0.05 N/20 mm to 5 N/20 mm. Furthermore, the pressure-sensitive adhesive force of the part 12*b* other than the semiconductor wafer-attaching part 12*a* toward the part 32*b* other than the foregoing part 32*a* is preferably within the range of 0.50 N/20 mm to 20 N/20 mm, more preferably within the range of 0.70 N/20 mm to 15 N/20 mm. Incidentally, the foregoing pressure-sensitive adhesive force is a value measured under conditions of an ordinary temperature (23° C.), a peeling angle of 180°, and a peeling rate of 300 mm/min.

The film for semiconductor back surface 2 (or 12) is preferably protected with a separator (release liner, not shown in figures). The separator has a function as a protective material for protecting the wafer back surface protective film until it is practically used. Moreover, the separator can be further used as a supporting base material at the time when the film for semiconductor back surface 2 (or 12) is transferred to the pressure-sensitive adhesive layer 32 on the base material of the dicing tape. The separator is peeled off when a semiconductor wafer is attached onto the film for semiconductor back surface of the dicing tape-integrated film for semiconductor back surface 1. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

The film for semiconductor back surface 2 (or 12) is preferably protected with a separator having a release layer on at least one surface.

Moreover, the light transmittance with a visible light (visible light transmittance, wavelength: 400 to 800 nm) in the film for semiconductor back surface 2 (or 12) is not particularly restricted but is, for example, preferably in the range of 20% or less (0 to 20%), more preferably 10% or less (0 to 10%), and particularly preferably 5% or less (0 to 5%). When the film for semiconductor back surface 2 (or 12) has a visible light transmittance of more than 20%, there is a concern that the transmission of the light may adversely influence the semiconductor element. The visible light transmittance (%) can be controlled by the kind and content of the resin components of the film for semiconductor back surface 2 (or 12), the kind and content of the coloring agent (such as pigment or dye), the content of the inorganic filer, and the like.

The visible light transmittance (%) of the film for semiconductor back surface 2 (or 12) can be determined as follows. Namely, a film for semiconductor back surface 2 (or 12) having a thickness (average thickness) of 20 μm itself is prepared. Men, the film for semiconductor back surface 2 (or 12) is irradiated with a visible light having a wavelength of 400 to 800 nm in a prescribed intensity (apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film for semiconductor back surface 2 (or 12). In this regard, it is also possible to derive visible light transmittance (%; wavelength: 400 to 800 nm) of the film for semiconductor back surface 2 (or 12) having a thickness of 20 μm from the value of the visible light transmittance (%; wavelength: 400 to 800 nm) of the film for semiconductor back surface 2 (or 12) whose thickness is not 20 μm. In the invention, the visible light transmittance (%) is determined in the case of the film for semiconductor back surface 2 (or 12) having a thickness of 20 μm, but the film for semiconductor back surface according to the invention is not limited to one having a thickness of 20 μm.

Moreover, as the film for semiconductor back surface 2 (or 12), one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the film for semiconductor back surface 2 (or 12) and the semiconductor element can be suppressed or prevented in the reflow step. The moisture absorbance is a value calculated from a weight change before and after the film for semiconductor back surface 2 (or 12) is allowed to stand under an atmosphere of a temperature of 85° C. and a humidity of 85% RH for 168 hours. In the case where the film for semiconductor back surface 2 (or 12) is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the film for semiconductor back surface 2 (or 12), one having a smaller ratio of volatile matter is more preferred. Specifically, the ratio of weight decrease (weight decrease ratio) of the film for semiconductor back surface 2 (or 12) after heating treatment is preferably 1% by weight or less and more preferably 0.8% by weight or less. The conditions for the heating treatment are a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the film for semiconductor back surface 2 (or 12) is formed of a resin composition containing a thermosetting resin component, the weight decrease ratio is a value obtained when the film for semiconductor back surface after thermal curing is heated under conditions of a temperature of 250° C. and a heating time of 1 hour.

(Dicing Tape)

The dicing tape 3 includes a base material 31 and a pressure-sensitive adhesive layer 32 formed on the base material 31. Thus, the dicing tape 3 sufficiently has a configuration in which the base material 31 and the pressure-sensitive adhesive layer 32 are laminated. The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 (or 12) is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

The pressure-sensitive adhesive layer 32 is formed of at least a radiation-curable pressure-sensitive adhesive, which has been cured beforehand (in advance) by irradiation with a radiation ray. The cured part is not necessarily the whole region of the pressure-sensitive adhesive layer 32. It is sufficient that at least the part 32a corresponding to the film for semiconductor back surface 2 or the semiconductor wafer-attaching part 12a in the film for semiconductor back surface 12 has been cured (see FIGS. 1 and 2). In the case of the dicing tape-integrated film for semiconductor back surface 1 shown in FIG. 1, a dicing ring 35 can be fixed to the part 32b in the pressure-sensitive adhesive layer 32. As the dicing ring 35, one composed of a metal such as stainless steel or one made of a resin can be used. When the part 32b in the pressure-sensitive adhesive layer 32 is not irradiated with a radiation ray, the part 32b is in an uncured state, so that the part 32b has a pressure-sensitive adhesive force larger than that of the foregoing part 32a. Therefore, the part 32b can surely adhere and fix the dicing ring 35. In the case of the dicing tape-integrated film for semiconductor back surface 11 shown in FIG. 2, the film for semiconductor back surface 12 is provided on the whole surface of the pressure-sensitive adhesive layer 32, so that the part 32b, which is not irradiated with a radiation ray and is uncured, is pressure-sensitively adhered to the film for semiconductor back surface 12. Accordingly, holding force at dicing a semiconductor wafer can be secured. As above, the pressure-sensitive adhesive layer 32 can support the film for semiconductor back surface 12 for fixing a semiconductor element to an adherend such as a substrate with a good balance between adhesion and peeling.

The film for semiconductor back surface 2 (or 12) can be provided on the pressure-sensitive adhesive layer 32 after subjecting the pressure-sensitive adhesive layer 32 to irradiation with a radiation ray. In this configuration, at least the surface of the foregoing part 32a of the pressure-sensitive adhesive layer 32 is hard and, at the attachment to the film for semiconductor back surface 2 (or 12), it becomes possible to lower the close adhesiveness between both. Accordingly, an anchoring effect between the pressure-sensitive adhesive layer 32 and the film for semiconductor back surface 2 (or 12) is lowered and, for example, at the picking-up of a semiconductor chip, the peeling property between the pressure-sensitive adhesive layer 32 and the film for semiconductor back surface 2 (or 12) becomes good. As a result, the picking-up property can be improved. Moreover, when the pressure-sensitive adhesive layer 32 is cured by irradiation with a radiation ray, there is formed the pressure-sensitive adhesive layer 32 whose volume is diminished as compared with that of the pressure-sensitive adhesive layer precursor. Therefore, for example, when the pressure-sensitive adhesive layer is cured by irradiation with a radiation ray after the attachment to the film for semiconductor back surface 2 (or 12), a stress is imparted to the film for semiconductor back surface 2 (or 12). As a result, warp occurs over the whole dicing tape-integrated film for semiconductor back surface in some cases. However, in the configuration in which the film for semiconductor back surface 2 (or 12) is formed on the pressure-sensitive adhesive layer 32 after subjecting the pressure-sensitive adhesive layer 32 to irradiation with a radiation ray, such stress is not imparted and hence a dicing tape-integrated film for semiconductor back surface 1 (or 11) without warp can be obtained.

Moreover, the film for semiconductor back surface 2 (or 12) may be provided on the pressure-sensitive adhesive layer precursor before the irradiation with a radiation ray. In this case, the pressure-sensitive adhesive layer 32 is formed by irradiating the pressure-sensitive adhesive layer precursor after the formation of the film for semiconductor back surface 2 (or 12) with a radiation ray. In such a configuration, the pressure-sensitive adhesive layer 32 and the film for semiconductor back surface 2 (or 12) have been attached to each other in a laminated state with maintaining a good peeling ability and without impairing mutual close adhesiveness. Therefore, the pressure-sensitive adhesiveness of both is prevented from decreasing excessively. For example, even in the case where a semiconductor element having a chip size of less than 1 mm×1 mm is prepared by dicing, the occurrence of chip fly can be prevented. In addition, since at least the foregoing part 32a of the pressure-sensitive adhesive layer 32 is in a cured state, interfacial failure can be easily induced between the part 32a and the film for semiconductor back surface 2 (or 12). As a result, the peeling property between both is improved, so that the picking-up property is excellent even when an extremely thin semiconductor element having a thickness of 25 μm to 75 μm is picked up, for example.

In the dicing tape-integrated film for semiconductor back surface 1 shown in FIG. 1, the film is designed so that the pressure-sensitive adhesive force of the foregoing part 32a of the pressure-sensitive adhesive layer 32 toward the film for semiconductor back surface 2 is usually smaller than the pressure-sensitive adhesive force of the foregoing part 32b toward the dicing ring 35. Specifically, in view of the fixing and holding force of a wafer and the recovering property of chips formed, the pressure-sensitive adhesive force of the part 32a of the pressure-sensitive adhesive layer 32 toward the film for semiconductor back surface 2 is preferably within the range of 0.02 N/20 mm to 1.5 N/20 mm more preferably within the range of 0.05 N/20 mm to 1 N/20 mm. When the pressure-sensitive adhesive force is less than 0.02 N/20 mm, the adhesion and fixing of a semiconductor element is insufficient, so that there is a case that chip fly occurs at dicing. On the other hand, when the pressure-sensitive adhesive force exceeds 1.5 N/20 mm, the pressure-sensitive adhesive layer 32 excessively adhere the film for semiconductor back surface 2, so that the picking-up of the semiconductor element becomes difficult in some cases. Moreover, the pressure-sensitive adhesive force of the foregoing part 32b toward the dicing ring 35 is preferably within the range of 0.02 N/20 mm to 10 N/20 mm, more preferably within the range of 0.05 N/20 mm to 5 N/20 mm. Even when the foregoing part 32a has a low pressure-sensitive adhesive force, a holding force necessary for wafer processing can be exhibited with suppressing the occurrence of chip fly and the like by the pressure-sensitive adhesive force of the other part 32b. Incidentally, the pressure-sensitive adhesive force is a value measured under conditions of an ordinary temperature (23° C.), a peeling angle of 180°, and a peeling rate of 300 mm/min.

In the dicing tape-integrated film for semiconductor back surface 11 shown in FIG. 2, the film is designed so that the pressure-sensitive adhesive force of the foregoing part 32a of the pressure-sensitive adhesive layer 32 toward the semiconductor wafer-attaching part 12a in the film for semiconductor back surface 2 is usually smaller than the pressure-sensitive adhesive force of the foregoing part 32b toward the part 12b other than the attaching part 12a. The pressure-sensitive adhesive force of the part 32a toward the attaching part 12a is preferably within the range of 0.02 N/20 mm to 1.5 N/20 mm, more preferably within the range of 0.05 N/20 mm to 1 N/20 mm as described above. The pressure-sensitive adhesive force of the part 32b toward the part 12b is preferably within the range of 0.02 N/20 mm to 10 N/20 mm, more preferably within the range of 0.05 N/20 mm to 5 N/20 mm. Even when the part 32a has a low pressure-sensitive adhesive force, a holding force necessary for wafer processing can be exhibited with suppressing the occurrence of chip fly and the like by the pressure-sensitive adhesive force of the other part 32b. Incidentally, the pressure-sensitive adhesive force is a value measured under conditions of an ordinary temperature (23° C.), a peeling angle of 180°, and a peeling rate of 300 mm/min.

Here, when the diameter of the semiconductor wafer is taken as r1, the diameter of the foregoing part 32a in the pressure-sensitive adhesive layer 32 is taken as r2, and the diameter of the film for semiconductor back surface 2 or the semiconductor wafer-attaching part 12a in the film for semiconductor back surface 12 is taken as r3, it is preferred to satisfy a relation: r1<r2<r3. Thereby, the whole surface of the semiconductor wafer can be adhered and fixed onto the film for semiconductor back surface 2 (or 12). Moreover, in the dicing tape-integrated film for semiconductor back surface 1, a peripheral part of the film for semiconductor back surface 2 can be adhered and fixed on the part 32b in the pressure-sensitive adhesive layer 32. Furthermore, in the dicing tape-integrated film for semiconductor back surface 11, a peripheral part of the semiconductor wafer-attaching part 12a in the film for semiconductor back surface 12 can be adhered and fixed on the part 32b in the pressure-sensitive adhesive layer 32. In such a structure, since the pressure-sensitive adhesive force of the foregoing part 32b is larger than that of the foregoing part 32a, adhesion and fixation becomes possible at the peripheral part of the film for semiconductor back surface 2 (or film for semiconductor back surface 12) and, as a result, the occurrence of chip fly at dicing can be further prevented.

As the radiation-curable pressure-sensitive adhesive, an internal UV curable pressure-sensitive adhesive (internal-type UV curable pressure-sensitive adhesive) in which a polymer having a radically reactive carbon-carbon double bond in an acrylic polymer side chain or main chain is used as the base polymer, an addition-type radiation-curable pressure-sensitive adhesive in which a UV curable monomer component or oligomer component is blended into an acrylic pressure-sensitive adhesive, and the like can be used. Since the internal UV curable pressure-sensitive adhesive should not contain the oligomer component or the like that is a low-molecular-weight component or does not contain the component in most cases, a pressure-sensitive adhesive layer having a stable layer structure can be formed without migration of the oligomer component or the like with the lapse of time, so that the internal UV curable pressure-sensitive adhesive can be suitably used as the radiation-curable pressure-sensitive adhesive. In this regard, the UV curable pressure-sensitive adhesive may be a UV curable pressure-sensitive adhesive in which the internal UV curable pressure-sensitive adhesive and the addition-type UV curable pressure-sensitive adhesive are mixed. Specifically, there can be used a UV curable pressure-sensitive adhesive in which a UV curable monomer component or an oligomer component is blended into the internal UV curable pressure-sensitive adhesive containing a base polymer (particularly, an acrylic polymer) having a radically reactive carbon-carbon double bond to such a degree that characteristic properties are not deteriorated.

In the invention, as the acrylic polymer, there may be mentioned those in which an acrylic acid ester is used as a main monomer component. Examples of the acrylic acid ester include acrylic acid alkyl esters (e.g., esters of a straight chain or branched chain alkyl group having 1 to 30 carbon atoms, particularly 4 to 18 carbon atoms, such as a methyl ester, an ethyl ester, a propyl ester, an isopropyl ester, a butyl ester, an isobutyl ester, a sec-butyl ester, a t-butyl ester, a pentyl ester, an isopentyl ester, a hexyl ester, a heptyl ester, an octyl ester, a 2-ethylhexyl ester, an isooctyl ester, a nonyl ester, a decyl ester, an isodecyl ester, an undecyl ester, a dodecyl ester, a tridecyl ester, a tetradecyl ester, a hexadecyl ester, an octadecyl ester, an eicosyl ester, etc.) and acrylic acid cycloalkyl esters (e.g., a cyclopentyl ester, a cyclohexyl ester, etc.). These monomers may be employed singly or in a combination of two or more kinds.

Among such acrylic acid esters exemplified in the above, in the invention, monomers represented by the chemical formula $CH_2$=CHCOOR (where R is an alkyl group having 6 to 10 carbon atoms, more preferably 8 to 9 carbon atoms) are preferably used. When the number of the carbon atoms is 6 or more, it is suppressed to have too large peeling force and the picking-up property is prevented from lowering. On the other hand, when the number of the carbon atoms is 10 or less, the decrease in the adhesiveness with the film for semiconductor back surface 2 (or 12) is suppressed and, as a result, the occurrence of chip fly can be prevented at dicing. Moreover, in the case where the acrylic acid ester is represented by the chemical formula $CH_2$=CHCOOR, the blending ratio is preferably 50 to 91 mol %, more preferably 80 to 87 mol % based on 100 mol % of the acrylic acid ester in the acrylic polymer. When the blending ratio is less than 50 mol %, the peeling force becomes too large and the picking-up property may lower in some cases. On the other hand, when the ratio exceeds 90 mol %, the pressure-sensitive adhesiveness lowers and there is a case that chip fly occurs at dicing. Furthermore, among the monomers represented by the foregoing chemical formula, 2-ethylhexyl acrylate, isooctyl acrylate, and isononyl acrylate are particularly preferred.

The acrylic polymer may be one in which a hydroxyl group-containing monomer copolymerizable with the acrylic acid ester is used as a monomer component. Examples of the hydroxyl group-containing monomer include 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl (meth)acrylate, 12-hydroxylauryl(meth)acrylate, and (4-hydroxymethylcyclohexyl)methyl(meth)acrylate. As the hydroxyl group-containing monomer, hydroxyalkyl(meth)acrylates whose alkyl group in the hydroxyalkyl group has 2 to 4 carbon atoms (e.g., 2-hydroxyethyl(meth)acrylate, 2-hydroxypropyl (meth)acrylate, 4-hydroxybutyl(meth)acrylate, etc.) are suitable. Among them, hydroxyalkyl acrylates whose alkyl group in the hydroxyalkyl group has 2 to 4 carbon atoms (e.g., 2-hydroxyethyl acrylate, 2-hydroxypropyl acrylate, 4-hydroxybutyl acrylate, etc.) can be suitably used. The hydroxyl group-containing monomer can be employed singly or in combination of two or more kinds.

The blending ratio of the hydroxyl group-containing monomer is preferably within the range of 10 to 40 mol %, preferably within the range of 15 to 30 mmol % based on 100 mol % of the acrylic acid ester. When the blending ratio is less than 10 mol %, the crosslinking after UV irradiation is insufficient and the picking-up property may lower in some cases. On the other hand, when the blending ratio exceeds 40 mol %, the polarity of the pressure-sensitive adhesive increases and the interaction with the film for semiconductor back surface 2 (or 12) becomes high, so that peeling becomes difficult.

For the purpose of modifying cohesive force, heat resistance, and the like, the acrylic polymer may contain a unit corresponding to other monomer component copolymerizable with the acrylic acid alkyl ester. Examples of such a monomer component include methacrylic acid alkyl esters such as methyl methacrylate, ethyl methacrylate, propyl methacrylate, isopropyl methacrylate, butyl methacrylate, isobutyl methacrylate, t-butyl methacrylate, s-butyl methacrylate, and pentyl methacrylate; carboxyl group-containing monomers such as acrylic acid, methacrylic acid, carboxylethyl(meth)acrylate, carboxylpentyl(meth)acrylate, itaconic acid, maleic acid, fumaric acid, and crotonic acid; acid anhydride monomers such as maleic anhydride and itaconic anhydride; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl(meth)acrylate, and (meth)acryloyloxynaphthalenesulfonic acid; phosphoric acid group-containing monomers such as 2-hydroxyethylacryloyl phosphate; and methacrylamide, acrylonitrile, and methacrylic acid cycloalkyl ester. These copolymerizable monomer components can be employed singly or in a combination of two or more kinds. The amount of the copolymerizable monomer to be used is preferably 40% by weight or less based on the total monomer components. However, in the case of the carboxyl group-containing monomer, the boundary face between the pressure-sensitive adhesive layer 32 and the film for semiconductor back surface 2 (or 12) disappears by the reaction of the carboxyl group with the epoxy group in the epoxy resin in the film for semiconductor back surface 2 (or 12), so that the peeling property between the both may lower. Therefore, the amount of the carboxyl group-containing monomer to be used is preferably 0 to 3% by weight based on the total monomer components. Moreover, among these monomer components, the acrylic polymer constituting the pressure-sensitive adhesive layer 32 of the invention preferably contains no acrylic acid as the monomer component. This is because acrylic acid diffuses into the film for semiconductor back surface 2 (or 12) and may result in disappearance of the boundary face between the pressure-sensitive adhesive layer 32 and the film for semiconductor back surface 2 (or 12) to lower the peeling property in some cases.

Here, the acrylic polymer preferably contains no polyfunctional monomer as the monomer for copolymerization. Thereby, there is no possibility of diffusion of the polyfunctional monomer into the film for semiconductor back surface 2 (or 12) and thus the lowering of the picking-up property owing to the disappearance of the boundary face between the pressure-sensitive adhesive layer 32 and the film for semiconductor back surface 2 (or 12) can be prevented.

In addition, an acrylic polymer in which a radically reactive carbon-carbon double bond is introduced into the side chain or main chain or into the main chain end of the acrylic polymer (particularly, a hydroxyl group-containing acrylic polymer) can be obtained by using an isocyanate compound having a radically reactive carbon-carbon double bond in the molecule. Examples of the isocyanate compound include methacryloyl isocyanate, 2-methacryloyloxyethyl isocyanate, 2-acryloyloxyethyl isocyanate, and m-isopropenyl-α,α-dimethylbenzyl isocyanate.

The blending ratio of the isocyanate compound having a radically reactive carbon-carbon double bond in the molecule is preferably within the range of 70 to 90 mol %, more preferably within the range of 75 to 85 mol % based on 100 mol % of the hydroxyl group-containing monomer. When the blending ratio is less than 70 mol %, the crosslinking after UV irradiation is insufficient and the picking-up property may lower in some cases. On the other hand, when the blending ratio exceeds 90 mol %, the polarity of the pressure-sensitive adhesive increases and the interaction with the film for semiconductor back surface 2 (or 12) becomes high, so that picking-up property lowers.

The acrylic polymer is obtained by subjecting the aforementioned monomer mixture to polymerization. The polymerization can be also carried out by any method of solution polymerization, emulsion polymerization, bulk polymerization, suspension polymerization, and the like. In view of prevention of staining of a clean adherend, a smaller content of low-molecular-weight substances is more preferred. From such a viewpoint, the weight-average molecular weight of the acrylic polymer is preferably 350,000 to 1,000,000 and further preferably about 450,000 to 800,000. The weight-average molecular weight is measured by GPC (gel permeation chromatography) and is a value calculated in terms of polystyrene.

In the invention, a compound having two or more radically reactive carbon-carbon double bonds in the molecule may be blended into the internal UV curable pressure-sensitive adhesive. The compound having two or more radically reactive carbon-carbon double bonds in the molecule is used for adjusting a degree of crosslinking, adjusting tensile elastic modulus, and the like. As the compound having two or more radically reactive carbon-carbon double bonds in the molecule, there may be mentioned UV curable monomer components and oligomer components to be used in the addition type radiation-curable pressure-sensitive adhesives. Specifically, examples of components of such compound having two or more radically reactive carbon-carbon double bonds in the molecule include monomers such as urethane oligomers, urethane (meth)acrylates, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butanediol di(meth)acrylate. Moreover, the foregoing isocyanate compounds may be also mentioned. Furthermore, various UV curable oligomers such as urethane-based, polyether-based, polyester-based, polycarbonate-based, and polybutadiene-based oligomers may be mentioned, and those having a molecular weight in the range of about 100 to 30,000 are suitable. Moreover, the blending ratio of the compound having two or more radically reactive carbon-carbon double bonds in the molecule is 500 parts by weight or less (e.g., 5 parts by weight to 500 parts by weight), preferably about 40 parts by weight to 150 parts by weight based on 100 parts by weight of the acrylic polymer constituting the pressure-sensitive adhesive. When the blending ratio is less than 5 parts by weight, the degree of crosslinking after irradiation with a radiation ray is low, so that the tensile elastic modulus decreases. As a result, at dicing of a semiconductor wafer, in the case where a dicing ring is attached onto the pressure-sensitive adhesive layer 32, paste residue occurs on the dicing ring. At the picking-up of semiconductor chips, the picking-up property may lower owing to too large peeling force in some cases. On the other hand, when the blending ratio exceeds 500 parts by weight, tensile elastic modulus increases. As a result, there is a case that chip fly occurs at dicing.

The method of introducing the radically reactive carbon-carbon double bond into the acrylic polymer is not particularly restricted and various methods can be adopted. However, it is easy to introduce the radically reactive carbon-carbon double bond into a polymer side chain in view of molecular design. For example, there may be mentioned a method in which a monomer having a hydroxyl group is copolymerized into the acrylic polymer beforehand and then an isocyanate compound having an isocyanate group reactive with the hydroxyl group and a radically reactive carbon-carbon double bond is subjected to a condensation or addition reaction with maintaining UV curability of the radically reactive carbon-carbon double bond. As the isocyanate compound having an isocyanate group and a radically reactive carbon-carbon double bond, those exemplified in the above may be mentioned.

The LTV curable pressure-sensitive adhesive preferably contains a photopolymerization initiator. Examples of the photopolymerization initiator include α-ketol-based compounds such as 4-(2-hydroxyethoxy)phenyl (2-hydroxy-2-propyl) ketone, α-hydroxy-α,α'-dimethylacetophenone, 2-methyl-2-hydroxypropiophenone, and 1-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether-based compounds such as benzoin ethyl ether, benzoin isopropyl ether, and anisoin methyl ether; ketal-based compounds such as benzyl dimethylketal; aromatic sulfonyl chloride-based compounds such as 2-naphthalenesulfonyl chloride; optically active oxime-based compounds such as 1-phenone-1,1-propanedione-2-(o-ethoxycarbonyl) oxime; benzophenone-based compounds such as benzophenone, benzoylbenzoic acid, and 3,3'-dimethyl-4-methoxybenazophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphor quinone; halogenated ketones; acylphosphinoxides; and acylphosphonates. The blending amount of the photopolymerization initiator is for example, about 0.05 to 20 parts by weight based on 100 parts by weight of the base polymer such as the acrylic polymer constituting the pressure-sensitive adhesive.

In the pressure-sensitive adhesive layer 32 of the dicing tape-integrated film for semiconductor back surface 1 (or 11), a portion of the pressure-sensitive adhesive layer precursor may be irradiated with a radiation ray so that the pressure-sensitive adhesive force of the foregoing part 32a is smaller than the pressure-sensitive adhesive force of the part 32b. Namely, using one where all or a portion of the part other than the part corresponding to the film for semiconductor back surface 2 or the semiconductor wafer-attaching part 12a of the film for semiconductor back surface 12 on at least one surface of the base material 31 is light-shielded, the pressure-sensitive adhesive layer precursor is irradiated with a radiation ray to cure the part corresponding to the film for semiconductor back surface 2 or the semiconductor wafer-attaching part 12a, thereby being able to form the foregoing part 32a having a lowered pressure-sensitive adhesive force. As a light-shielding material, one capable of being a photo mask on the supporting film can be prepared by printing, vapor deposition, or the like.

Incidentally, in the case where curing inhibition by oxygen occurs at irradiation with a radiation ray, it is desirable to shut off oxygen (air) from the surface of the radiation-curable pressure-sensitive adhesive layer 32. Examples of the method include a method including covering the surface of the pressure-sensitive adhesive layer 32 with a separator, a method including performing the irradiation with a radiation ray such as a UV ray in a nitrogen gas atmosphere, and the like.

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent can be used for adjusting the pressure-sensitive adhesive force before UV irradiation, adjusting the pressure-sensitive adhesive force after UV irradiation, and the like. By using the crosslinking agent, external, crosslinking can be achieved. The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted but is appropriately determined depending on the balance with the base polymer (particularly acrylic polymer) to be crosslinked and further depending on the use application as a pressure-sensitive adhesive. In general, the crosslinking agent is preferably blended about 20 parts by weight or less, further 0.1 part by weight to 10 parts by weight based on 100 parts by weight of the base polymer.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexamdiol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer precursor and then transferring (transcribing) it on the base material 31; or the like. Further, by irradiation with a radiation ray under the aforementioned conditions, the pressure-sensitive adhesive layer 32 can be formed. The irradiation with a radiation ray may be performed on the pressure-sensitive adhesive layer precursor before the attachment of the film for semiconductor back surface 2 (or 12) or may be performed after the attachment of the film for semiconductor back surface 2 (or 12).

The thickness of the pressure-sensitive adhesive layer 32 is not particularly restricted and, for example, is preferably about 5 μn to 300 μm, preferably 5 μm to 200 μm, further preferably 5 μm to 100 μm, and particularly preferably 7 μm to 50 μm. When the thickness of the pressure-sensitive adhesive layer 32 is within the above-mentioned range, an appropriate pressure-sensitive adhesive force can be exhibited. The pressure-sensitive adhesive layer may be either a single layer or a multi layer.

Incidentally, in the invention, the dicing tape-integrated film for semiconductor back surface 1 (or 11) can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2 (or 12), or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface 2 (or 12) is preferably non-conductive from the viewpoint of having no electric leakage.

Moreover, the dicing tape-integrated film for semiconductor back surface 1 (or 11) may be formed in a form where it is wound as a roll or may be formed in a form where the sheet (film) is laminated. For example, in the case where the film has the form where it is wound as a roll, the film is wound as a roll in a state that the film for semiconductor back surface 2 (or 12) is protected by a separator according to needs, whereby the film can be prepared as a dicing tape-integrated film for semiconductor back surface 1 (or 11) in a state or form where it is wound as a roll. In this regard, the dicing tape-integrated film for semiconductor back surface 1 (or 11) in the state or form where it is wound as a roll may be constituted by the base material 31, the pressure-sensitive adhesive layer 32 formed on one surface of the base material 31, the film for semiconductor back surface 2 (or 12) formed on the pressure-sensitive adhesive layer 32, and a releasably treated layer (rear surface treated layer) formed on the other surface of the base material 31.

Incidentally, the thickness of the dicing tape-integrated film for semiconductor back surface 1 (total thickness of the thickness of the film for semiconductor back surface and the thickness of the dicing tape including the base material 31 and the pressure-sensitive adhesive layer 32) can be, for example, selected from the range of 8 μm to 1,500 μm, and it is preferably from 20 μm to 850 μm, more preferably 31 μm to 500 μm, and particularly preferably 47 μm to 330 μm.

In this regard, in the dicing tape-integrated film for semiconductor back surface 1 (or 11), by controlling the ratio of the thickness of the film for semiconductor back surface 2 (or 12) to the thickness of the pressure-sensitive adhesive layer 32 of the dicing tape 3 or the ratio of the thickness of the film for semiconductor back surface 2 (or 12) to the thickness of the dicing tape (total thickness of the base material 31 and the pressure-sensitive adhesive layer 32), a dicing property at the dicing step, a picking-up property at the picking-up step, and the like can be improved and the dicing tape-integrated film for semiconductor back surface 1 (or 11) can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film for semiconductor back surface 1 shown in FIG. 1 as an example.

First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive layer precursor is formed by applying a pressure-sensitive adhesive composition onto the base material 31, followed by drying (by crosslinking under heating, if necessary). Examples of the application method include roll coating, screen coating, and gravure coating. In this regard, the pressure-sensitive adhesive composition may be directly applied onto the base material 31 to form the pressure-sensitive adhesive layer precursor on the base material 31, or the pressure-sensitive adhesive composition may be applied onto a release paper or the like whose surface has been subjected to a releasable treatment to form a pressure-sensitive adhesive layer precursor and then the pressure-sensitive adhesive layer precursor may be transferred onto the base material 31. Further, in the case where irradiation curing is performed before the attachment to the film for semiconductor back surface 2 (or 12), the pressure-sensitive adhesive layer precursor is directly irradiated with a radiation ray at this stage. Thereby, a dicing tape 3 in which the pressure-sensitive adhesive layer 32 is formed on the base material 31 is prepared.

The irradiation with a radiation ray is preferably carried out in the range of 50 mJ/cm$^2$ to 2,000 ml/cm$^2$, and further preferably in the range of 100 mJ/cm$^2$ to 1,000 ml/cm$^2$. The irradiation with a radiation at 50 mJ/cm$^2$ or more (particularly, 100 mJ/cm$^2$ or more) makes the curing of the pressure-sensitive adhesive layer 32 sufficient and prevents the layer from exceedingly adhering with the film for semiconductor back surface 2 (or 12). As a result, a good picking-up performance becomes possible and the attachment of the pressure-sensitive adhesive to the film for semiconductor back surface 2 (or 12) after picking-up (so-called adhesive residue) can be prevented. On the other hand, the irradiation with a radiation at 2,000 mJ/cm$^{2t}$ or less (particularly, 1,000 mJ/cm$^2$ or less) can reduce thermal damage to the base material 31. In addition, excessive progress of the curing of the pressure-sensitive adhesive layer 32 to result in too much increase in the tensile elastic modulus and thus decrease in the expanding property can be prevented. Furthermore, too much decrease in the pressure-sensitive adhesive force is prevented and thereby, the occurrence of chip fly can be prevented at dicing of the semiconductor wafer. Incidentally, as the radiation ray, an X-ray, UV ray, electron beam, and the like may be mentioned.

On the other hand, a coated layer is formed by applying a forming material for forming the film for semiconductor back surface 2 onto a release paper so as to have a prescribed thickness after drying and further drying under prescribed conditions (in the case where thermal curing is required or the like, performing a heating treatment to achieve drying, if necessary). By transferring the coated layer onto the pressure-sensitive adhesive layer 32, the film for semiconductor back surface 2 is formed on the pressure-sensitive adhesive layer 32 (or pressure-sensitive adhesive layer precursor). In this regard, the film for semiconductor back surface 2 can be also formed on the pressure-sensitive adhesive layer 32 (or pressure-sensitive adhesive layer precursor) by directly applying the forming material for forming the film for semiconductor back surface 2 onto the pressure-sensitive adhesive layer 32 (or pressure-sensitive adhesive layer precursor), followed by drying under prescribed conditions (in the case where thermal curing is required or the like, performing a heating treatment to achieve drying, if necessary). In the case of the pressure-sensitive adhesive layer precursor, the irradiation with a radiation ray is performed from the base material 31 side at this stage or a later stage. Consequently, the dicing tape-integrated film for semiconductor back surface 1 according to the invention can be obtained. Incidentally, in the case where thermal curing is performed at the formation of the film for semiconductor back surface 2, it is important to perform the thermal curing to such an extent that this is in a partially cured state. However, it is preferable that the thermal curing is not performed.

The dicing tape-integrated film for semiconductor back surface 1 (or 11) of the invention can be suitably used at the production of a semiconductor device including the flip chip connection step. Namely, the dicing tape-integrated film for semiconductor back surface 1 (or 11) of the invention is used at the production of a flip chip-mounted semiconductor device and thus the flip chip-mounted semiconductor device is produced in a condition or form where the film for semiconductor back surface 2 (or 12) of the dicing tape-integrated film for semiconductor back surface 1 (or 11) is attached to the back surface of the semiconductor chip. Therefore, the dicing tape-integrated film for semiconductor back surface 1 (or 11) of the invention can be used for a flip chip-mounted semiconductor device (a semiconductor device in a state or form where the semiconductor chip is fixed to an adherend such as a substrate by a flip chip bonding method).

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Process of Semiconductor Device)

The process for producing a semiconductor device according to the invention will be described referring to FIGS. 3A to 3D. FIGS. 3A to 3D are cross-sectional schematic views showing a process for producing a semiconductor device in the case where a dicing tape-integrated film for semiconductor back surface 1 is used.

According to the process for producing a semiconductor device, the semiconductor device can be produced using the dicing tape-integrated film for semiconductor back surface 1. Specifically, the process at least includes a step of attaching a semiconductor wafer 4 onto the film for semiconductor back surface 2 in the dicing tape-integrated film for semiconductor back surface 1, a step of dicing the semiconductor wafer 4 to form a semiconductor element 5, a step of peeling the semiconductor element 5 from the pressure-sensitive adhesive layer 32 of the dicing tape 3 together with the film for semiconductor back surface 2, and a step of flip chip-connecting the semiconductor element 5 onto the adherend 6. Moreover, the irradiation with a radiation ray to the pressure-sensitive adhesive layer 32 is not performed from the step of attaching the semiconductor wafer 4 until the step of peeling the semiconductor element 5.

(Mounting Step)

Figure 3A:
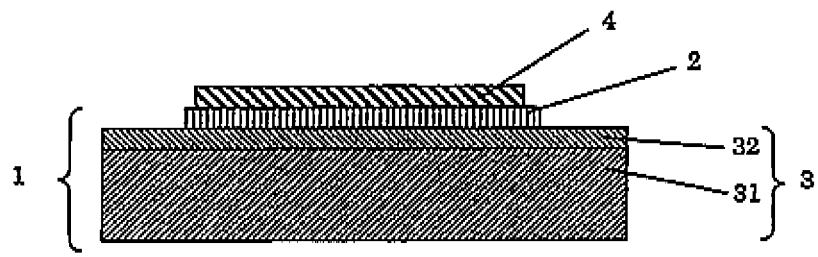
FIGS. 3A to 3D are cross-sectional schematic views showing one embodiment of a process for producing a semiconductor device using a dicing tape-integrated film for semiconductor back surface of the invention.

First, as shown in FIG. 3A, a separator optionally provided on the film for semiconductor back surface 2 of the dicing tape-integrated film for semiconductor back surface 1 is suitably peeled off and the semiconductor wafer 4 is attached onto the film for semiconductor back surface 2 to be fixed by adhesion and holding (mounting step). On this occasion, the film for semiconductor back surface 2 is in an uncured state (including a semi-cured state). Moreover, the dicing tape-integrated film for semiconductor back surface 1 is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 3B:
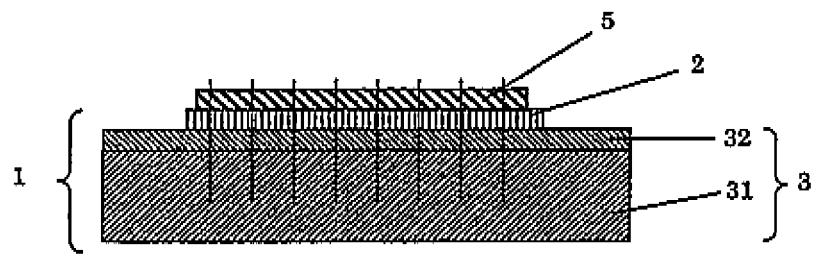

Next, as shown in FIG. 3B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film for semiconductor back surface 1. The dicing apparatus used in the present step is not particularly restricted, and a conventionally known apparatus can be used. Further, since the semiconductor wafer 4 is adhered and fixed by the dicing tape-integrated film for semiconductor back surface 1 having the film for semiconductor back surface, chip crack and chip fly can be suppressed, as well as the damage of the semiconductor wafer 4 can also be suppressed.

In this regard, when the film for semiconductor back surface 2 is formed of a resin composition containing an epoxy resin, generation of adhesive extrusion from the pressure-sensitive adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case where the dicing tape-integrated film for semiconductor back surface 1 is expanded, the expansion can be performed using a conventionally known expanding apparatus. The expanding apparatus has a doughnut-shaped outer ring capable of pushing the dicing tape-integrated film for semiconductor back surface 1 downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Picking-Up Step)

Figure 3C:
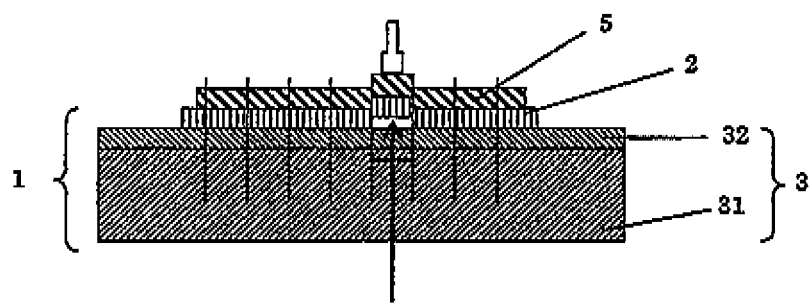

In order to collect the semiconductor chip 5 that is adhered and fixed to the dicing tape-integrated film for semiconductor back surface 1, picking-up of the semiconductor chip 5 is performed as shown in FIG. 3C to peel the semiconductor chip 5 together with the film for semiconductor back surface 2 from the dicing tape 3. The method of picking-up is not particularly restricted, and conventionally known various methods can be adopted. For example, there may be mentioned a method including pushing up each semiconductor chip 5 from the base material 31 side of the dicing tape-integrated film for semiconductor back surface 1 with a needle and picking-up the pushed semiconductor chip 5 with a picking-up apparatus. However, in the invention, since the pressure-sensitive adhesive layer 32 has been cured beforehand by irradiation with a radiation ray, irradiation of the pressure-sensitive adhesive layer 32 with a radiation ray is not performed. In this regard, the back surface of the picked-up semiconductor chip 5 is protected with the film for semiconductor back surface 2.

(Flip Chip Connection Step)

Figure 3D:
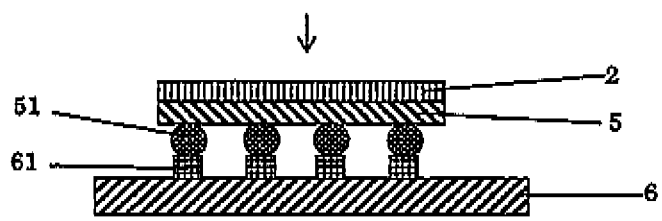

The picked-up semiconductor chip 5 is fixed to an adherend 6 such as a substrate by a flip chip bonding method (flip chip mounting method) as shown in FIG. 3D. Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face side of the semiconductor chip 5 is brought into contact with a conductive material 61 (such as solder) for conjunction attached to a connecting pad of the adherend 6 and the conductive material 61 is melted under pressing, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6 and the distance between the gaps is generally about 30 μm to 300 μm. In this regard, after the flip chip bonding of the semiconductor chip 5 on the adherend 6, it is important that the opposing faces of the semiconductor chip 5 and the adherend 6 and the gaps are washed and an encapsulating material (such as an encapsulating resin) is then filled into the gaps to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step (flip chip connection step), the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, the encapsulating resin is cured as the thermal curing proceeds. Moreover, by the step, film for semiconductor back surface 2 can be completely or almost completely cured and can be attached to the back surface of the semiconductor element with excellent close adhesiveness. Further, the film for semiconductor back surface 2 according to the invention can be thermally cured together with the encapsulating material at the encapsulation step even when the film is in an uncured state, so that it is not necessary to newly add a step for thermal curing of the film for semiconductor back surface 2.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film for semiconductor back surface 1 and the film for semiconductor back surface, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film for semiconductor back surface 1 of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

Preparation of Film for Flip Chip Type Semiconductor Back Surface 113 parts of an epoxy resin (a trade name "EPICOAT 1004" manufactured by JER Co., Ltd.), 121 parts of a phenol resin (a trade name "MILER XLC-4L" manufactured by Mitsui Chemicals, Inc.), 246 parts of sphere silica (a trade name "so-25R" manufactured by Admatechs Co., Ltd.), 5 parts of Dye 1 (a trade name "OIL GREEN 502" manufactured by Orient Chemical Industries Co., Ltd.), and 5 parts of Dye 2 (a trade name "OIL BLACK BS" manufactured by Orient Chemical Industries Co., Ltd.) based on 100 parts of an acrylic acid ester-based polymer (a trade name "PARACRON W-197CM" manufactured by Negami Chemical Industrial Co., Ltd.) containing ethyl acrylate and methyl methacrylate as main components were dissolved in methyl ethyl ketone to prepare a solution of a resin composition having a solid concentration of 23.6% by weight.

The solution of the resin composition was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface A having a thickness (average thickness) of 20 μm.

<Preparation of Dicing Tape>

In a reaction vessel fitted with a cooling tube, a nitrogen inlet tube, a thermometer, and a stirring apparatus were placed 88.8 parts of 2-ethylhexyl acrylate (hereinafter referred to as "2EHA"), 11.2 parts of 2-hydroxyethyl acrylate (hereinafter referred to as "HEA"), 0.2 part of benzoyl peroxide, and 65 parts of toluene, and the whole was subjected to a polymerization treatment in a nitrogen stream at 61'C for 6 hours to obtain an acrylic polymer A having a weight-average molecular weight of 850,000. The molar ratio of 2EHA to HEA was 100 mol to 20 mol.

To the acrylic polymer A was added 12 parts (80 mol % based on HEA) of 2-methacryloyloxyethyl isocyanate (hereinafter referred to as "MOI"), and the whole was subjected to an addition reaction treatment in an air stream at 50° C. for 48 hours to obtain an acrylic polymer A'.

Then, 8 parts of a polyisocyanate compound (a trade name "COLONATE L", manufactured by Nippon Polyurethane Industry Co., Ltd.) and 5 parts of a photopolymerization initiator (a trade name "IRGACURE 651", manufactured by Ciba Specialty Chemicals) were added to 100 parts of the acrylic polymer A' to obtain a pressure-sensitive adhesive solution.

The pressure-sensitive adhesive solution prepared in the above was applied onto a silicone-treated face of a PET release liner and thermal crosslinking was carried out at 120° C. for 2 minutes to form a pressure-sensitive adhesive layer precursor having a thickness of 10 μm. Then, a polyolefin film having a thickness of 100 μm was attached onto the surface of the pressure-sensitive adhesive layer precursor, followed by storage at 50° C. for 24 hours. Thereafter, only the part of the pressure-sensitive adhesive layer precursor corresponding to the semiconductor wafer-attaching part in the film for semiconductor back surface was irradiated with a UV ray, thereby forming a pressure-sensitive adhesive layer. Thus, a dicing tape according to the present invention was prepared. The irradiation conditions of the UV ray were as follows.

<Irradiation Conditions of UV Ray>
 UV irradiation apparatus: high-pressure mercury lamp
 UV irradiation integrated light quantity: 500 mJ/cm$^2$
 Output: 75 W
 Irradiation intensity: 150 mW/cm$^2$
 Incidentally, UV irradiation was directly performed to the pressure-sensitive adhesive layer precursor.

<Preparation of Dicing Tape-Integrated Film, for Semiconductor Back Surface>

The foregoing film for semiconductor back surface A was attached onto the pressure-sensitive adhesive layer of the dicing tape using a laminator to prepare a dicing tape-integrated film for semiconductor back surface. In this regard, the conditions of the laminator are as follows.

<Laminator Conditions>
 Laminator apparatus: LPA330/450
 Laminator temperature: 40° C.
 Laminator speed: 1,600 mm/min Comparative Example 1

A dicing tape-integrated film for semiconductor back surface according to the present Comparative Example was prepared in the same manner as in Example 1 except that the surface of the pressure-sensitive adhesive layer precursor was not irradiated with the UV ray.

(Evaluation)

With regard to the dicing tape-integrated films for semiconductor back surfaces prepared in Example 1 and Comparative Example 1, a dicing property, a picking-up property, a flip chip bonding property, and storage stability were evaluated or measured by the following methods. The results of the evaluation or measurement are also shown in Table 1.

<Evaluating Method of Dicing Property/Picking-Up Property>

Using the dicing tape-integrated films for semiconductor back surface of Example 1 and Comparative Example 1, the dicing property was evaluated by actually dicing a semiconductor wafer and then peeling ability was evaluated, thus dicing performance and picking-up performance of the dicing tape-integrated films for semiconductor back surface being evaluated.

First, a semiconductor wafer (diameter: 8 inches, thickness: 0.6 mm; a silicon mirror wafer) was subjected to a back surface polishing treatment and a mirror wafer having a thickness of 0.2 mm was used as a workpiece. After the separator was peeled from the dicing tape-integrated film for semiconductor back surface, the mirror wafer (diameter: 8 inches, thickness: 200 μm; a silicon mirror wafer) was attached onto the film for semiconductor back surface by roller press-bonding at 70° C. Further, dicing of the mirror wafer was performed. The dicing was performed as full cut so as to be a chip size of 10 mm square. In this regard, attaching conditions and dicing conditions are as follows.

(Conditions for Semiconductor Wafer Grinding)
 Grinding apparatus: a trade name "DFG-8560" manufactured by DISCO Corporation
 Semiconductor wafer: 8 inch diameter (back surface was ground so as to be until a thickness of 0.2 mm from a thickness of 0.6 mm)

(Attaching Conditions)
 Attaching apparatus: a trade name "MA-3000III" manufactured by Nitta Seiki Co., Ltd.
 Attaching speed: 10 mm/min
 Attaching pressure: 0.15 MPa
 Stage temperature at the time of attaching: 70° C.

(Dicing Conditions)
 Dicing apparatus: a trade name "DFD-6361" manufactured by DISCO Corporation
 Dicing ring: "2-8-1" (manufactured by DISCO Corporation)
 Dicing speed: 30 mm/sec
 Dicing blade:
  Z1; "2030-SE 27HCDD" manufactured by DISCO Corporation
  Z2; "2030-SE 27HCBB" manufactured by DISCO Corporation
 Dicing blade rotation speed:
  Z1; 40,000 r/min
  Z2; 45,000 r/min
 Cutting method: step cutting
 Wafer chip size: 10.0 mm square In the dicing, the presence of peeling of the mirror wafer and the presence of chip fly of the semiconductor chip were confirmed. The case where the dicing was well performed was ranked "Good" and the case where the dicing was not well performed was ranked "Poor", thus the dicing property being evaluated.

Next, the semiconductor chips obtained by dicing were picked up from the pressure-sensitive adhesive layer together with the film for flip chip type semiconductor back surface by pushing up the chips from the dicing tape side of the dicing tape-integrated film for semiconductor back surface with a needle. The picking-up success ratio (%) of the semiconductor chips (400 pieces in total) on this occasion was determined to evaluate the picking-up property. Therefore, the picking-up property is better when the picking-up ratio is closer to 100%. In this regard, the picking-up conditions are as follows.

(Picking-Up Conditions)
 Picking-up apparatus: a trade name "SPA-300" manufactured by Shinkawa Co., Ltd.
 Number of picking-up needles: 1 needle
 Pushing-up speed of needle: 20 mm/s
 Pushing-up distance of needle: 500 μm
 Picking-up time: 1 second
 Dicing tape-expanding amount: 3 mm <Evaluation Method for Flip Chip Bonding Property>

Subsequently, the semiconductor chip was flip chip-bonded on a circuit board. On this occasion, the circuit face of the semiconductor chip was opposed to the circuit board, a bump formed at the circuit face of the semiconductor chip was brought into contact with a conductive material (solder) for conjunction attached to a connecting pad of the circuit board, and the conductive material was melted under pressure by raising the temperature to 260° C. and then cooled to room temperature, thereby performing the flip chip bonding. Further, an underfill material as an encapsulating resin was injected into the gaps between the semiconductor chip and the circuit board.

(Evaluation Standard for Flip Chip Bonding Property)

Good: Mounting could be achieved by the flip chip bonding method with no trouble.

Poor: Mounting could not be achieved by the flip chip bonding method.

(Evaluation for Storage Stability>

After the films for dicing tape-integrated semiconductor back surface shown in Example 1 and Comparative Example 1 were prepared, the films were allowed to stand under an atmosphere of 40° C. for 30 days. Thereafter, the foregoing dicing property, picking-up property, and flip chip bonding property were similarly evaluated.

TABLE 1

|  | Before storage stability test | | | After storage stability test | | |
| --- | --- | --- | --- | --- | --- | --- |
|  | Dicing property | Picking-up property | Flip chip bonding property | Dicing property | Picking-up property | Flip chip bonding property |
| Example 1 | Good | 100% | Good | Good | 100% | Good |
| Comparative Example 1 | Good | 10% | Good | Good | 3% | Good |

(Results)

As seen from Table 1, it is confirmed that the dicing tape-integrated film for semiconductor back surface according to Example 1 can be diced without occurring chipping and the like of the semiconductor wafer and also is excellent in the picking-up property. Furthermore, flip chip bonding can be well performed. Moreover, even after the dicing tape-integrated film for semiconductor back surface is allowed to stand under an atmosphere of 40° C. for 30 days, it is confirmed that the film is excellent in the dicing property, picking-up property, and flip chip bonding property.

While the present invention has been described in detail and with reference is to specific embodiments thereof; it will be apparent to one skilled in the art that various changes and modifications can be made therein without departing from the scope thereof.

This application is based on Japanese patent application No. 2010-096298 filed Apr. 19, 2010, the entire contents thereof being hereby incorporated by reference.

What is claimed is:

1. A dicing tape-integrated film for semiconductor back surface comprising:
   a dicing tape comprising a base material and a pressure-sensitive adhesive layer on the base material; and
   a film for flip chip type semiconductor back surface, which is provided on the pressure-sensitive adhesive layer,
   wherein the pressure-sensitive adhesive layer comprises at least a cured portion and an uncured portion, and
   wherein the dicing tape-integrated film for semiconductor back surface satisfies a relation: $r1 < r2 < r3$,
   wherein $r1$ is a diameter of a semiconductor wafer; $r2$ is a diameter of the cured portion in the pressure-sensitive adhesive layer, which corresponds to the film for flip chip type semiconductor back surface or a semiconductor wafer-attaching part in the film for flip chip type semiconductor back surface; and $r3$ is a diameter of the film for flip chip type semiconductor back surface or the semiconductor wafer-attaching part in the film for flip chip type semiconductor back surface.

2. The dicing tape-integrated film for semiconductor back surface according to claim 1, wherein the film for flip chip type semiconductor back surface is attached onto the cured portion of the pressure-sensitive adhesive layer.

3. The dicing tape-integrated film for semiconductor back surface according to claim 1, wherein the cured portion of the pressure-sensitive adhesive layer is a part corresponding to a semiconductor wafer-attaching part in the film for flip chip type semiconductor back surface.

4. The dicing tape-integrated film for semiconductor back surface according to claim 2, wherein the cured portion of the pressure-sensitive adhesive layer is a part corresponding to a semiconductor wafer-attaching part in the film for flip chip type semiconductor back surface.

5. The dicing tape-integrated film for semiconductor back surface according to claim 1, wherein the film for flip chip type semiconductor back surface contains a coloring agent.

6. The dicing tape-integrated film for semiconductor back surface according to claim 2, wherein the film for flip chip type semiconductor back surface contains a coloring agent.

7. The dicing tape-integrated film for semiconductor back surface according to claim 3, wherein the film for flip chip type semiconductor back surface contains a coloring agent.

8. The dicing tape-integrated film for semiconductor back surface according to claim 4, wherein the film for flip chip type semiconductor back surface contains a coloring agent.

9. A process for producing a semiconductor device using the dicing tape-integrated film for semiconductor back surface according to claim 1, the process comprising:
   attaching a semiconductor wafer onto the film for flip chip type semiconductor back surface in the dicing tape-integrated film for semiconductor back surface,
   dicing the semiconductor wafer to form a semiconductor element,
   peeling the semiconductor element from the pressure-sensitive adhesive layer of the dicing tape together with the film for flip chip type semiconductor back surface, and
   flip chip-connecting the semiconductor element onto an adherend,
   wherein the pressure-sensitive adhesive layer is not irradiated with a radiation ray from said attaching of the semiconductor wafer until said peeling of the semiconductor element.

10. A flip chip type semiconductor device, which is manufactured by the process for producing the semiconductor device according to claim 9.

* * * * *